US010318680B2

(12) United States Patent
El-Ghazawi et al.

(10) Patent No.: US 10,318,680 B2
(45) Date of Patent: Jun. 11, 2019

(54) RECONFIGURABLE OPTICAL COMPUTER

(71) Applicant: The George Washington University, Washington, DC (US)

(72) Inventors: Tarek El-Ghazawi, Vienna, VA (US); Volker J. Sorger, Alexandria, VA (US); Shuai Sun, Vienna, VA (US); Abdel-Hameed A. Badawy, Little Rock, AR (US); Vikram K. Narayana, Ashburn, VA (US)

(73) Assignee: The George Washington University, Washington, DC (US)

( * ) Notice: Subject to any disclaimer, the term of this patent is extended or adjusted under 35 U.S.C. 154(b) by 79 days.

(21) Appl. No.: 15/369,371

(22) Filed: Dec. 5, 2016

(65) Prior Publication Data

US 2017/0161417 A1 Jun. 8, 2017

Related U.S. Application Data

(60) Provisional application No. 62/263,266, filed on Dec. 4, 2015.

(51) Int. Cl.
*G02B 1/00* (2006.01)
*G06F 17/50* (2006.01)
*H04J 14/02* (2006.01)

(52) U.S. Cl.
CPC ...... *G06F 17/5036* (2013.01); *G06F 17/5054* (2013.01); *H04J 14/0212* (2013.01)

(58) Field of Classification Search
CPC ........ B82Y 20/00; G02B 6/1225; G02B 1/04; G02B 26/001; G02F 2202/022

USPC ......................................................... 359/321
See application file for complete search history.

(56) References Cited

U.S. PATENT DOCUMENTS 6,141,676 A * 10/2000 Ramirez-Angulo ..... G06G 7/40
                                                               708/802
9,831,928 B2 * 11/2017 Kim .......................... H04B 1/40

OTHER PUBLICATIONS

Alu et al.; *Epsilon-Near-Zero (ENZ) Metamaterials and Electromagnetic Sources: Tailoring the Radiation Phase Pattern*; University of Pennsylvania Scholarly Commons, Department of Electrical & Systems Engineering; Physical Review B 75, 155410-1 to 155410-13 (2007).
Nader Enghest; *Circuits with Light at Nanoscales: Optical Nanocircuits Inspired by Metamaterials*; www.sciencemag.org; Science vol. 317; pp. 1698-1702; Sep. 21, 2007.
G. Liebmann et al.; *Solution of Partial Differential Equations with a Resistance Network Analogue*; British Journal of Applied Physics, pp. 92-103 (1949).
Seth Lloyd; *Ultimate physical limits to computation*; Insight Review Articles; Nature; pp. 1047-1054; vol. 406; Aug. 21, 2000; www.nature.com.

(Continued)

*Primary Examiner* — Mohammed A Hasan
(74) *Attorney, Agent, or Firm* — Blank Rome LLP

(57) ABSTRACT

An optical-electronic device can be controlled by a bias voltage to simulate an electronic component such as a resistor, capacitor, inductor with resistor, or capacitor with resistor. The optical-electronic device can be connected in a network to perform computations, model problems, simulate properties such as physical properties (for instance heat transfer), and achieve circuit performances to carry out computations in the analog domain, all at faster speed with smaller size and at less energy.

29 Claims, 7 Drawing Sheets

(56) References Cited

OTHER PUBLICATIONS

Ma et al.; *Indium-Tin-Oxide for High-performance Electro-optic Modulation*; Nanophotonics 2015; 4:198-213.
Narayana et al.; *Towards a Computational Model for Heat Transfer in Electrolytic Cells*; International Journal of Computer Theory and Engineering, vol. 6, No. 3, pp. 215-219, Jun. 2014.
Richter et al.; *Memristive Accelerator for Extreme Scale Linear Solvers*; Department of Electrical and Computer Engineering; University of Rochester, 4 pages, Mar. 2015.
Sethumadhavan et al.; *A Case for Hybrid Discrete-Continuous Architectures*; IEEE Computer Architecture Letters, vol. 10, No. 2, Jul. 2011, 4 pages.
Silva et al.; *Performing Mathematical Operations with Metamaterials*; ; Science vol. 343; Jan. 10, 2014; pp. 160-163; www.sciencemag.org.
Sorger et al.; *Plasmonic Fabry-Perot Nanocavity*; Nano Letters; vol. 9; No. 10; 3489-3493; 2009.
Sorger et al.; *Ultra-compact silicon nanophotonic modulator with broadband response*; Univeristy of California Berkeley; Nanophotonic (2012) 6 pages.
ThruChip Communications LLC; Contents of http://www.thruchip.com/applications.htm; Expected Applications.
Yin; *The Quest for Rt*; Application of resistivity-tool-response modeling for formation evaluation; AAPG Archie Series, No. 2, pp. 1-10; 2011.

\* cited by examiner

Figure 5(b)    Figure 5(c)

RECONFIGURABLE OPTICAL COMPUTER

RELATED APPLICATIONS

This application claims the benefit of U.S. Provisional Application No. 62/263,266, filed Dec. 4, 2015, the entire contents of which are incorporated herein by reference.

BACKGROUND OF THE INVENTION

Field of the Invention

The present invention relates to optical-electronic (or opto-electronic) devices. More particularly, the present invention relates to reconfigurable opto-electronic devices for use in networks for solving Partial Differential Equations (PDE).

Background of the Related Art

PDE solutions using electrical equivalent have been done, such as circuits implemented using resistors [LIEB50]. Documented efforts in the 1950s show resistor networks built using 300,000 resistors, and even a 500,000-resistor network was built in the 1970s [YIN11]. U.S. Pat. No. 6,141,676 also showed the possibility of solving different types of PDEs by using Resistor, Inductor and Capacitor elements. In addition, the use of electrical circuits and arrays of electrical components for solving PDEs in the analog domain has been previously explored [SETH12]. However, there is a need for faster and smaller solutions that require less energy.

SUMMARY OF THE INVENTION

There is a need to perform computations, model problems, simulate properties such as physical properties (for instance heat transfer), and achieve circuit performances, all at faster speed with smaller size and at less energy. The present invention provides a novel, programmable array of photonic R (and LC) components using nanoplasmonics technology in order to solve systems that can be described through differential equations and converted into electrical analogues, which can be regarded as a prototype of the Reconfigurable Optical Coprocessor (ROC). Key insights include: a) to draw an analogue between optical and electrical characteristics of nanoscale pieces of matter, b) utilizing nanophotonics to demonstrate dramatic and efficient tuning of the permittivity of Indium Tin Oxide (ITO) via altering the free carrier concentration electrically, and c) deploying an array of photonics resistors, capacitors, and inductors, with programmable values and connectivity patterns, in order to solve partial differential equations directly in the analog domain.

As such, the photonic components are on a separate die, connected with the rest of the system through 3D integration. The supporting electrical subsystem that is required for programming the photonic components, as well as enabling different connectivity patterns between them, will be provided on a separate die layer. Similarly, the host processing subsystem and DRAM will also be availed on different die layers, to ensure each of them is implemented in the most aggressive technology node option available. Through novel use of either purely resistive arrays, or a combination of resistances, inductances and capacitances, we can target different classes of applications, ranging from solution of linear equations to solution of Ordinary Differential Equations (ODE) and Partial Differential Equations (PDE).

Towards this end, we provide an overview of using electrical analogues for solving PDEs. Other applications such as linear equations can be solved through analog computing.

These and other objects of the invention, as well as many of the intended advantages thereof, will become more readily apparent when reference is made to the following description, taken in conjunction with the accompanying drawings.

BRIEF DESCRIPTION OF THE FIGURES

FIG. 5(b) is a 2D discretization of the temperature output variable, centered around one point of interest;

FIG. 5(c) is a basic electric network building block that exhibits equivalence to the heat distribution equations at each point of interest;

DETAILED DESCRIPTION OF THE PREFERRED EMBODIMENTS

Figure 1A:
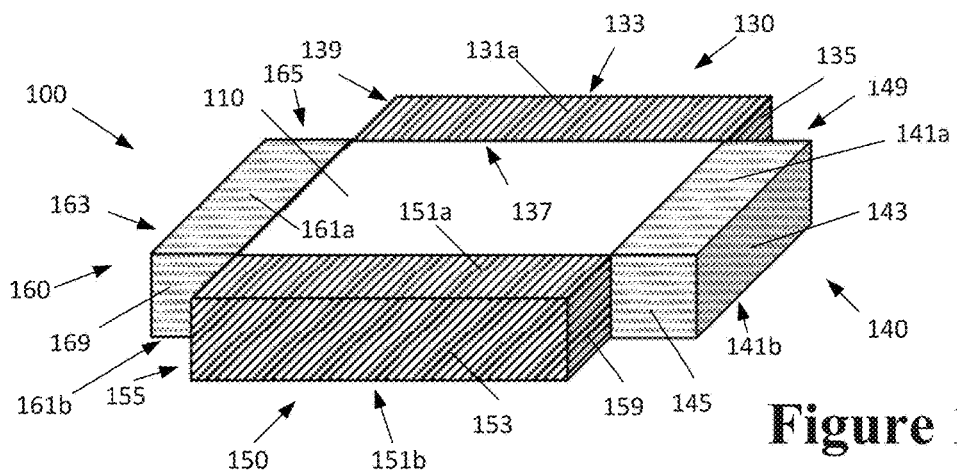
FIG. 1(a) is a perspective view of a metanano circuit element structure in accordance with an example embodiment of the invention.

In describing a preferred embodiment of the invention illustrated in the drawings, specific terminology will be resorted to for the sake of clarity. However, the invention is not intended to be limited to the specific terms so selected, and it is to be understood that each specific term includes all technical equivalents that operate in similar manner to accomplish a similar purpose. Several preferred embodiments of the invention are described for illustrative purposes, it being understood that the invention may be embodied in other forms not specifically shown in the drawings.

Figure 1B:
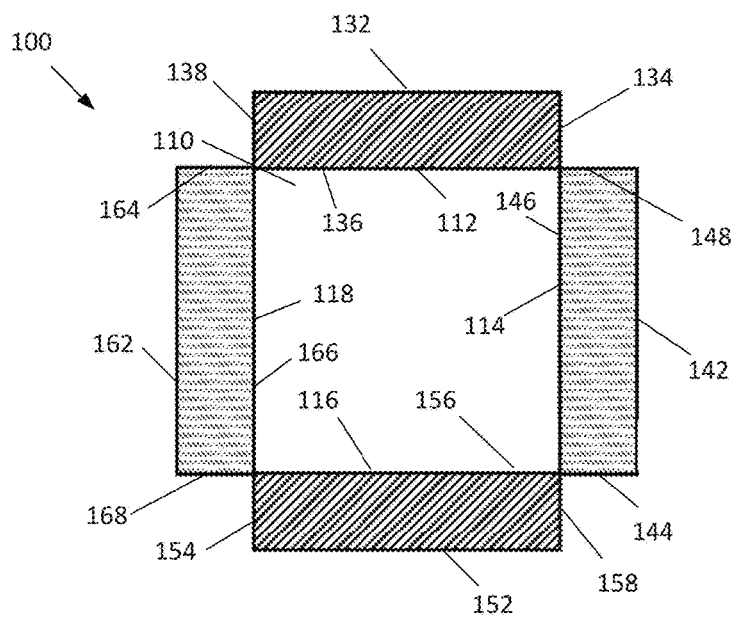
FIG. 1(b) is a top view of the circuit element of FIG. 1(a)
Figure 2:
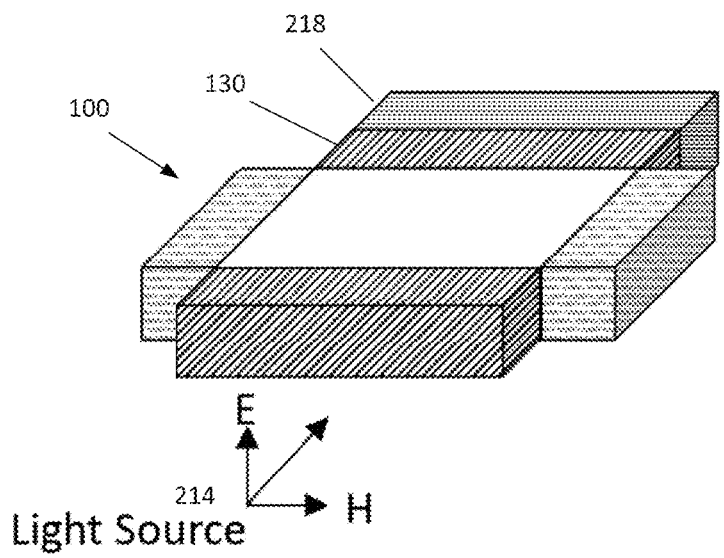
FIG. 2 is a perspective view of the metanano circuit element connected to a photodetector, where the front EVL material portion is used as the light input port and the rear EVL material portion is used as the light output port and connects to a photodetector.

Turning to the drawings, FIGS. 1(a), 1(b) show a nanoscale photonic active optical-electronic (or opto-electronic) device or circuit element 100 in accordance with an example, non-limiting, illustrative embodiment of the invention. The opto-electronic device 100 is the basic building block to a Reconfigurable Optical Coprocessor (ROC) network 200, such as shown in the example of FIG. 2. The metamaterial-based nano-circuit element 100 includes the following features: a) the performance of co-processing is dramatically increased by optical devices like a memristor that is realized in the optical domain since photonics lacks wire-capacitive limitations, b) classical (diffraction limited) optics require large footprint and high power overhead due to the inherent weak interaction between light and matter (i.e. the electronic dipole moment of matter is 3-orders of magnitude smaller relative to the wavelength of visible or NIR photons), c) digital electronics is limited by high bot-error-rates (BER) resulting in high entropy penalty. Here we utilize nanophotonic strategies (i.e. high Q/V optical concentration factors) and metasurfaces (MS, [LLOY00]) approaches to enable dramatic enhancements of this weak interaction enabling sub-wavelength compact devices with unprecedented electro-optical performance and able to perform the characteristics as optical resistors, capacitors and inductors, and d) efficient and ultra-fast optical phase-shaping strategies using emerging materials such indium tin oxide (ITO) allow for epsilon-near-zero (ENZ) elements on-chip.

The opto-electronic device 100 has a main body portion 110, a first material portion 130, a second material portion 140, a third material portion 150, and a fourth material portion 160. The main body 110, first material portion 130, second material portion 140, third material portion 150, and fourth material portion 160 are each configured to propagate optical signals. In one example embodiment of the invention, the main body 110 can be metal-like materials with negative real part of permittivity, dielectric materials with positive real part of permittivity, ENZ materials with non-zero imaginary part of permittivity or the combinations. The material portions 130-160 are all voltage controlled ITO blocks. Each of the first, second, third, and fourth material portions 130-160 have a specific material with a specific "displacement current transmissivity".

For example in the embodiment of FIGS. 1(a), 1(b), the first and third material portions 130, 150 can be the same material with the same transmissivity properties, such as an ITO that is voltage controlled to be an Epsilon Very Large (EVL) material; and the second and fourth material portions 140, 160 can have a same material with the same transmissivity properties, such as indium tin oxide (ITO) that is voltage controlled to be an Epsilon-Near-Zero (ENZ) material. EVL material is generally referred to here as the real part of the material permittivity being much larger than the vacuum permittivity ($Re(\varepsilon) \gg \varepsilon_0$). The ENZ material optically isolates the opto-electronic device 100 from the neighboring or adjacent opto-electronic device 100, which can be important when the opto-electronic devices 100 are combined into an array or network such as shown in FIGS. 3, 6(b), 6(c). The first and third material portions 130, 150 match, and the second and fourth material portions 140, 160 to build a path for the light. Since the first and third portions 130, 150 (EVL) form a wire, and the second and third portions (ENZ) form a shield and EVL. Thus, the light will travel from the first material portion 130 to the third material portion 150, or from the third material portion 150 to the first material portion 130.

The main body 110 can have any suitable shape, but in the example of FIGS. 1(a), 1(b) the main body 110 has a general square shape with a top side 112, bottom side 116 opposite the top side, a right side 114, and a left side 118 opposite the right side 114. The top side 112 has a top side surface, the bottom side 116 has a bottom side surface, the right side 114 has a right side surface, and the left side 118 has a left side surface. The side surfaces at the sides 112, 114, 116, 118 form input/output ports that allow light to pass into and out of the main body 110. Since the main body 110 has a square shape, the top side 112 is opposite and substantially parallel to the bottom side 116, the right side 114 is opposite and substantially parallel to the left side 118, and the top and bottom sides 112, 116 are substantially perpendicular to the right and left sides 114, 118.

The first material portion 130, second material portion 140, third material portion 150, and fourth material portion 160 can each have any suitable shape, but in the example of FIGS. 1(a), 1(b), they can each have a rectangular prism shape. Accordingly, the first, second, third, and fourth material portions 130, 140, 150, 160 are each elongated. In the embodiment shown, the first, second, third, and fourth material portions 130, 140, 150, 160 each respectively have a longitudinal top side 132, 142, 152, 162 with a top side surface 133, 143, 153, 163, a right transverse side 134, 144, 154, 164 with a right side surface 135, 145, 155, 165, a longitudinal bottom side 136, 146, 156, 166 with a bottom side surface 137, 147, 157, 167, and a left transverse side 134, 144, 154, 164 with a left side surface 135, 145, 155, 165.

In one example embodiment of the invention, the surfaces can be planar with a rectangular longitudinal cross section and a square transverse cross section. In addition, the four sides of the main body portion 110 and the elongated top and bottom sides of the material portions 130-160 can be 20 nm long, and the transverse sides of the material portions 130-160 can be 2 nm wide; and the main body 110 and material portions 130-160 can have a uniform thickness of 2 nm. It is noted that 2 nm is the approximate thickness of ITO (ENZ) that could be fully biased. The device shield can be thicker for better isolation and other suitable ENZ materials can be utilized similar to ITO.

The top and bottom side surfaces at the top and bottom sides 132, 142, 152, 162, 136, 146, 156, 166 form ports through which light can pass into and out of the material portions 130, 140, 150, 160 and the main body 110. Thus, for instance, light can come into the bottom side surface 153 at the bottom side 152, exit out through the top side surface 157 at the top side 156, into the main body through the bottom side surface at the bottom side 116, travel through the main body 110 and exit out through the top side surface at the top side 112 into the bottom side surface at the bottom side 136 of the material portion 130, and out through the top side surface at the top side 132. Of course, any suitable sizes and shapes can be utilized within the spirit and scope of the invention.

The material portions 130, 140, 150, 160 are each coupled with or formed integrally with the main body 110, so that the main body 110 is in light flow communication with each of the material portions 130-160 and the material portions 130-160 are in light flow communication with the main body 110. Thus, a light such as a laser from a laser source, can pass from the main body 110 to the material portions 130-160 without interruption, and can also pass from the material portions 130-160 to the main body without interruption. As illustrated, the bottom side 136 of the first material portion 130 is coupled with the top side 112 of the main body 110. More specifically, the four side surfaces of the main body 110 have the same size and shape as the longitudinal top and bottom side surfaces of the first, second, third, and fourth material portions 130, 140, 150, 160. Thus, the bottom side surface of the bottom sides 136, 146, 156, 166 of the first, second, third, and fourth material portions 130, 140, 150, 160 is coupled with or formed integrally with the top side surface, the right side surface, the bottom side surface, and the left side surface of the top side 112, right side 114, bottom side 116, and left side 118 of the main body 110, respectively.

In one embodiment of the invention, each of the material portions 130, 140, 150, 160 are closely aligned with the main body 110 without any gaps. Thus, for example, the material portions can touch the main body 110. The material portions can be integral with the main body 110 or can be adhered to the main body 110 such as by a Physical Vapor Deposition (PVD) (e.g., sputtering) or by bonding. In addition, an adhesive layer can be placed between the main body 110 and the material portions, depending on the materials used for the main body 110 and the material portions. The light traveling from the third material portion 150, through the main body 110 and the first material portion 130 will have a certain loss based on the imaginary part of the permittivity of the EVL and the material of the main body 110. The loss here is determined by the imaginary part of the material permittivity at certain frequency. Ideally, we want the EVL material to be "lossless" because it is just the "wire" of our device. However, since EVL material should have relatively high $\varepsilon 1$ ($\varepsilon 1 = n^2 - \kappa^2$), which means the real part of the refractive index n should be much higher than $\kappa$. In this case, any small amount of the imaginary part of the refractive index $\kappa$ will still cause a nonzero $\varepsilon 2$ ($\varepsilon 2 = 2n\kappa$). For example, ITO at the EVL (dielectric) state for 1310 nm wavelength has a refractive index 1.92-0.001i. The $\varepsilon 2 = 2 n\kappa = 2*1.92*0.001 = 0.00384 > 0 \rightarrow$"lossy". To mimic the 'resistor state', a lossy material can be utilized for the main body 110 to create loss for displacement current. However, at 'capacitor' and 'inductor' states, ideally we expect no losses.

Accordingly, the device 100 forms a metatronics-based nanophotonic memristor via a metanano circuit element [ENGH07] in the optical domain achieved by tunable material like ITO (see FIG. 4, [MA15]). The real and the imaginary part of the refractive index (n and $\kappa$) as well as the permittivity ($\varepsilon_1 = n^2 - \kappa^2$ and $\varepsilon 2 = 2n\kappa$) are shown in FIG. 4 at different carrier concentrations. Critical is the tunability of the permittivity via changing the carrier concentration inside the ITO (i.e., the material portions 130, 140, 150, 160, and the main body 110 at resistor state) and this can be realized by electrostatically gating the ITO, which forms an accumulation layer, thus, shifting the plasma frequency via the Drude model. This unique electro-optical property could achieve ENZ which is the key of matanano circuit elements [ALU07]. For example, at 1310 nm wavelength (shown by the dashed line) the ITO material without bias voltage (voltage OFF) has a carrier concentration at the level $10^{19}$ with $\varepsilon_1$ near 4 and $\varepsilon_2$ close to zero. In this case, since $\varepsilon_1$ is much higher than the permittivity at free space ($\varepsilon_0 = 8.85 \times 10^{-12}$ F/m), ITO at this state can be regarded as Epsilon-Very-Large (EVL) material. However, after applying certain voltage (voltage ON), the carrier concentration shifts from $10^{19}$ to $10^{21}$. Since the real part of the permittivity approaches close to zero, the ITO at this certain state can be regarded as an ENZ material.

After having the ENZ and EVL type materials, the metanano circuit elements [ENGH07] can be reproduced. Moreover, since ITO has both ENZ and EVL characteristics that can be switched by using bias voltage, ITO enables the reconfigurability of the metanano circuit elements (FIG. 1). The basic building block includes conducting sides along the light propagating direction with EVL material, shielding sides on other directions with ENZ material and the device part in the center that provide various characteristics depending on the its materials. Table 1 below indicates the available materials for the main body 110 of the device 100 with related details, for the dimensions noted above (the main body 110 being 20 nm×20 nm×2 nn), as one possible example of the invention. Other dimensions that much shorter than the wavelength of the light will still follow the same characteristics as discussed above while with different value of capacitance, inductance and resistance. Thus, the material portions 130-160 are all using ITO and can be under different bias voltage and can be switched between ENZ and EVL; while the materials for the main body 110 are listed in Table 1. In one embodiment, the main body 110 thickness is smaller than one-half the wavelength of the light that is transmitted through it, and the material portions can be on the order of tens of nanometers in thickness.

After analyzing the single optical RCL elements, it is valuable to combine them into a circuit by using ENZ and EVL material for shielding and conducting the "optical current". Note, the optical current here is no longer the conduction current in the traditional electrical circuit; instead, the electric displacement current density (the partial derivative of displacement field over time $\delta D/\delta t$) which arises from Maxwell equation should be used as the optical current flowing within these optical elements. The optical impedance, therefore, equals to the optical potential divided by the "optical current" and this characteristics has been proven that matches with the performance of the same device under RF domain analysis. For example, if the main body 110 uses $SiO_2$ material, this metanano element with proper shield and wire provides "optical capacitor" characteristics with a capacitance to the displacement current. However, if the material of the main body 110 changes to gold, the characteristics of this element will perform like an "optical inductor and resistor" lumped element with inductance and loss.

TABLE 1

| Material of the Main Body 110 | | | |
|---|---|---|---|
| Main Body 110 | Material | Category | Electrical Equivalents |
| $\varepsilon_1 > 0, \varepsilon_2 \approx 0$ | $SiO_2, Si_3N_4$ | Lossless dielectric | Capacitor |
| $\varepsilon_1 > 0, \varepsilon_2 > 0$ | Doped Si | Lossy dielectric | Capacitor with Resistor |
| $\varepsilon_1 \approx 0, \varepsilon_2 > 0$ | ITO (ENZ) | Loss | Resistor |
| $\varepsilon_1 < 0, \varepsilon_2 > 0$ | Au, Ag, Al | Metal | Inductor with Resistor |

Thus, the different characteristics of the metanano element 110 (capacitor, resistor, inductor or certain combinations) can be achieved by choosing different materials for the main body 110 than is listed in Table 1. And the ITO at voltage ON and OFF states could be used as the optical wire to connect with other elements and the optical shield to prevent the energy leakage. With the EVL material portions 130, 150 connecting to the top and the bottom sides 112, 116 of the main body 110 and the ENZ material portions 140, 160 connecting to the left and right sides 114, 118 of the main body 110, the displacement current only propagates in the direction parallel to the front-rear direction, but not able to transmit to the left nor right. Therefore, this single device element structure achieves different circuit element characteristics while maintaining the connection reconfigurability by changing the bias voltage of the outer materials 130-160 attached to it.

Adjacent Element Communication

Turning to FIG. 2, an example is shown of a metanano element 100 connecting to an optical detector or photodetector 218. The optical detector 218 can generally form the shape of a rectangle, with a top elongated side having a top side surface, a bottom elongated side having a bottom side surface, a right transverse side having a right side surface, and a left transverse side having a left side surface. The bottom surface of the photodetector 218 can have the same size and shape as the top surface of the first material portion 130. The bottom surface of the photodetector 218 can be coupled with or formed integrally with the top surface of the first material portion 130.

As mentioned, due to the large real part of the permittivity, the EVL 130 can be used as the wire to connect the element 100 to light sources 214 and photodetectors 218. A plane wave is used here as the light source 214 propagating norm to the front-rear direction. The material of the photodetector 218 can vary depending on the wavelength of the light source. However, the main goal of the photodetector 218 here is to absorb the light with high operating frequency which makes it able to monitor the light power change dynamically. The photodetector 218 detects the amplitude of light passing through the opto-electronic device 100. The amplitude is equivalent to the voltage in the electrical analogue (with a constant scaling factor depending on the chip and the problem formulation).

Figure 3A:
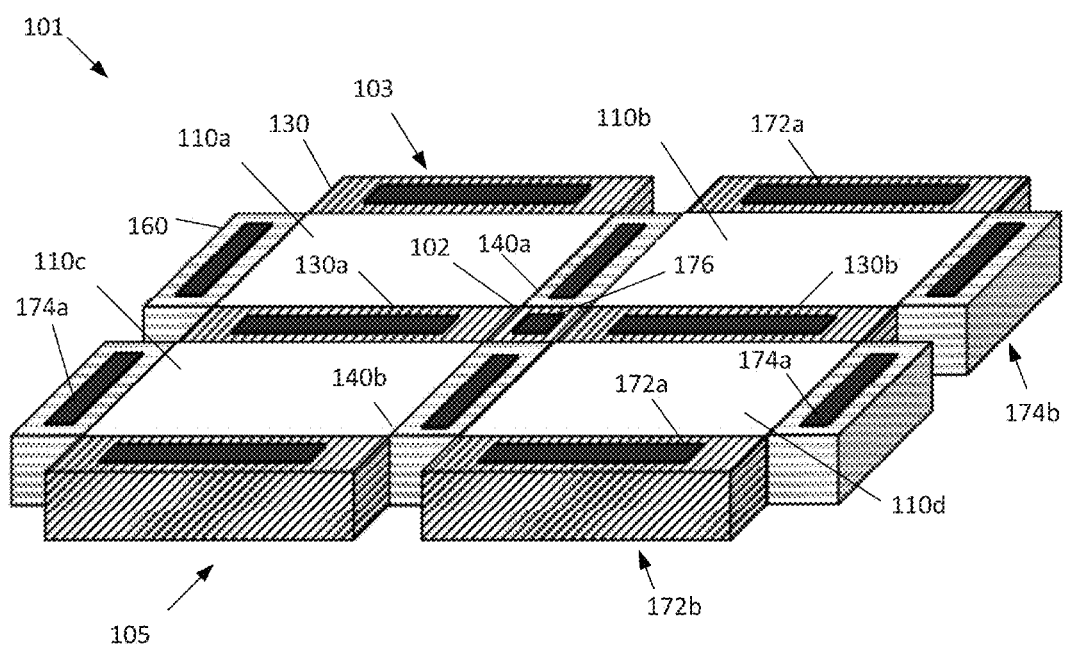
FIG. 3(a) is a perspective view of a 2×2 metanano circuit element array with a gate (voltage control) on each material portion.
Figure 3B:
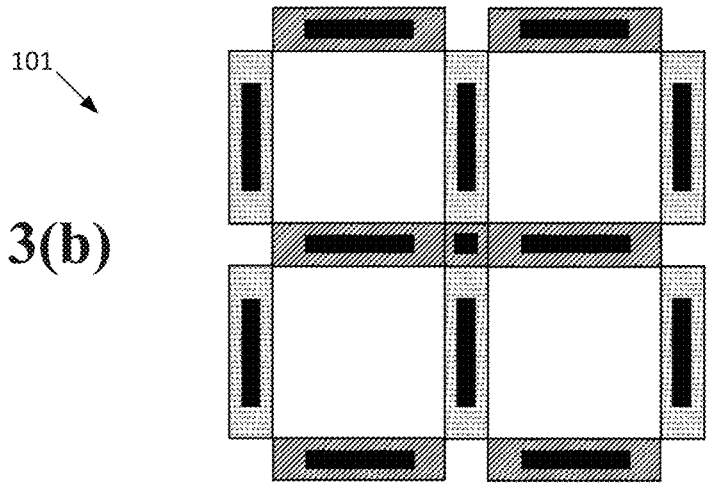
FIG. 3(b) is a top view of the circuit element array of FIG. 3(a)

Referring now to FIGS. 3(a), 3(b), the opto-electronic device 100 can be utilized in a circuit or network 101, such as a Reconfigurable Optical Coprocessor (ROC) network. Here, a simple 2×2 array is shown, though the device 100 can be utilized in large networks having many opto-electronic devices 100. As illustrated, a single material portion can be provided between adjacent main body portions 110. Each adjacent main body portion 110 need not have its own ENZ and EVL material portions, but instead each main body portion 110 can share a respective ENZ and EVL material portion with its neighboring adjacent main body portion 110.

For instance, the network 101 has four opto-electronic devices 100 with four main bodies 110a, 110b, 110c, 110d. The first and third main bodies 110a, 110c share a single EVL material portion 130a, which is located between the first and third opto-electronic main bodies 110a, 110c. Thus, the top surface 131a of the EVL material portion 130a is coupled with or formed integrally with the bottom surface of the first main body 110a; and the bottom surface 131b of the EVL material portion 130a is coupled with or formed integrally with the top surface of the third main body 110c. Likewise, the second and fourth main bodies 110b, 110d share a single EVL material portion 130b, which is located between the second and fourth opto-electronic main bodies 110b, 110d. Thus, the top surface 131a of the EVL material portion 130b is coupled with or formed integrally with the bottom surface of the second main body 110b; and the bottom surface 153 of the EVL material portion 130b is coupled with or formed integrally with the top surface of the fourth main body 110d.

In addition, the first and second main bodies 110a, 110b share a single ENZ material portion 140a, which is located between the first and second opto-electronic main bodies 110a, 110b. Thus, the left side surface 149 of the ENZ material portion 140a is coupled with or formed integrally with the right side surface 114 of the first main body 110a; and the right side surface 145 of the ENZ material portion 140a is coupled with or formed integrally with the left side surface of the second main body 110b. And, the third and fourth main bodies 110c, 110d share a single ENZ material portion 140b, which is located between the third and fourth opto-electronic main bodies 110c, 110d. Thus, the left side surface of the ENZ material portion 140b is coupled with or formed integrally with the right side surface 114 of the third main body 110c; and the right side surface of the ENZ material portion 140b is coupled with or formed integrally with the left side surface of the fourth main body 110d.

Finally, a center material portion 102 is positioned at the center of the network 101. The center material portion 102 can have the shape of a square with a top side having a top side surface, a bottom side having a bottom side surface, a right side having a right side surface, and a left side having a left side surface. The top surface is coupled with or formed integrally with the right side surface of the first ENZ material portion 140a; the left side surface is coupled with or formed integrally with the left side surface of the second EVL material portion 130b; the bottom side surface is coupled with or formed integrally with the right side surface of the first EVL material portion 130a; and the bottom surface is coupled with or formed integrally with the left side surface of the second ENZ material portion 140b. Thus, light can be communicated from the first EVL material portion 130a to the second EVL material portion 130b via the center portion 102, without interruption or interference; and light can also be communicated from the first ENZ material portion 140a to the second ENZ material portion 141b via the center portion 102, without interruption or interference. The center material portion 102 changes the topology of the four main bodies 110 by tuning the center material portion 102. If the center portion 176 is controlled (via the gate 176) to EVL, then the center portion 102 connects the four main bodies 110 in the manner shown by FIG. 3b. But if the center portion 102 is tuned to ENZ, it will separate the first main body 110a and the third main body 110c from the second main body 110b and the fourth main body 110d. The main body 102 cooperates with material portions 130a, 130b, 140a and 140b to change the overall topology. Simply tuning the main body 102 to EVL might not connect the four main bodies 110. In order to build the topology shown by FIG. 5b, we need to either: 1) tune material portions 130a, 102, 130b to EVL and others to ENZ, or 2) tune material portions 140a, 102, 140b to EVL and others to ENZ.

Thus, the EVL material 130 can be used as the "optical wire" since the high real part of the permittivity produce high displacement current; while within the ENZ material 140, the displacement current which equals to the product of the permittivity and electric field approximates to zero which prevents the optical current leakage. With a layer of EVL material in the center 102 connecting one side all the four elements 110 and four separate EVL strips connecting the other side as ports for this 2×2 array. Moreover, other sides of the opto-electronic device 100 should be covered by ENZ material to prevent leakage as well as crosstalk between adjacent elements 100. In other words, one or more devices 100 can be placed on top of or on the bottom of the device 100 shown, but the top (or front) side 103 and bottom (or rear) side 105 of the network 101 should be shielded by an ENZ.

As further shown in FIGS. 3(a), 3(b), an upper gate 172a, 174a, 176a and lower gate 172b, 174b, 176b can be provided on each of the material portions 130-160, 130a, 140a, 102 of FIGS. 1-3. The upper gates 172a, 174a, 176a are conductive flat metal plates that are coupled to the front or upper surface 131a, 141a, 151a, 161a of the respective material portion 130, 140, 150, 160. The lower gates 172b, 174b, 176b are conductive flat metal plates that are coupled to the rear or lower surface 131b, 141b, 151b, 161b of each material portion 130, 140, 150, 160. Each of the upper and lower gates 172a, 172b, 174a, 174b, 176a, 176b can have, for example, the same shape as the surface of the respective material portion 130-160, 130a, 130b, 140a, 140b, 176, but be smaller than that surface.

In addition, each edge of the gate can extend substantially parallel to the respective edge of the material portion. Thus, the gate 172, 174, 176 has a first side surface that is coupled to the upper/lower surface of the material portion, and a second side surface opposite the first side surface, that faces outward. A signal, such as a voltage signal, can be applied to the upper surface of the upper gate 172a, 174a, 176a. The voltage signal passes through the gate into the respective material portion, to control the operation of the respective material portion. The lower gates 172b, 174b, 176b are connected to ground, which creates a voltage potential between the upper and lower gates and induces a current to flow through the material portion 130, 140, 150, 160.

It is also worth to mention, since both the optical "shield" (i.e., ENZ) and the optical "wire" (i.e., EVL) of the element could be achieved by using the ITO, the connectivity could be dynamically controlled by changing the bias voltage of each side of the main body 110 cover. The optical shield prevents light from leaking and the optical wire propagates the light without interrupting the optical displacement current. The ENZ shield shields the displacement current which means there will still have some light in the shield but there is no displacement current inside since the displacement current $J=dD/dt=\varepsilon 1*(dE/dt)$ and $\varepsilon 1 \approx 0$ for ENZ material. Especially for larger scale ROC networks, this reconfigurability allows the network to switch from one topology to another using the same network design.

Accordingly, referring again to Table 1, if the main body 110 of the device 100 is controlled to have $\varepsilon_1 > 0$ and $\varepsilon_2 \approx 0$, and is made of $SiO_2$ or $Si_3N_4$ (or a lossless dielectric), then the opto-electronic device 100 (i.e., the main body portion 110) will simulate a capacitor. The optical impedance (capacitance/resistance/inductance) equals the optical potential over the main body 110 divided by the displacement current passing through the main body 110. The impedance can further be controlled by using different materials listed in Table 1. In order to have combined elements (e.g. inductor with resistor, capacitor with resistor), we can simply put two 110s coupled together in series. And if main body 110 of the device 100 is controlled to have $\varepsilon_1 \approx 0$ and $\varepsilon_2 > 0$, and is made of ITO (loss), then the main body 110 of the opto-electronic device 100 will simulate a resistor.

Figure 4A:
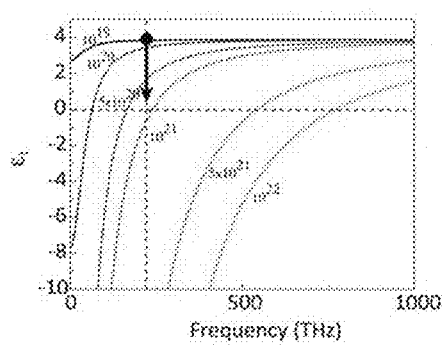
FIGS. 4(a), 4(b), 4(c), 4(d) are plots showing the ITO optical parameters based on Drude-Lorentz model.
Figure 4B:
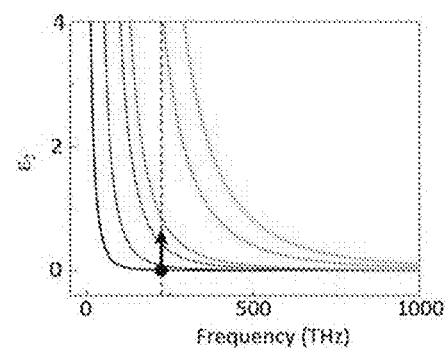
Figure 4C:
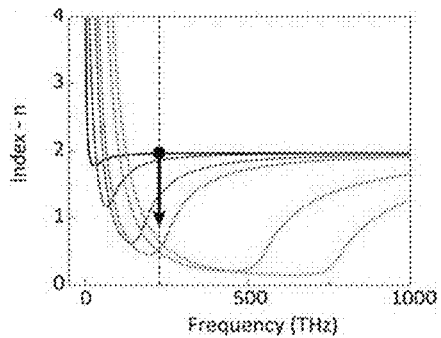
Figure 4D:
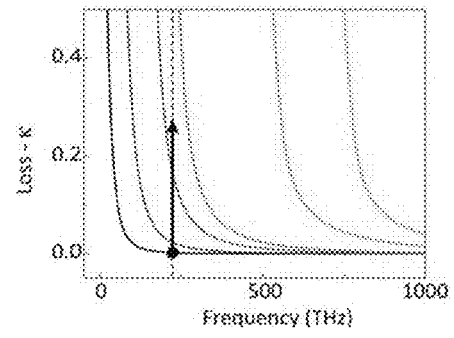

Referring to FIG. 4(a), the main body 110 can be controlled to have an $\varepsilon_1 \approx 0$ by providing a voltage bias of about 2V in order to change the carrier concentration from $10^{19}$ to $6.8 \times 10^{20}$, which as shown by the arrow in FIG. 4(a) causes $\varepsilon_1$ to go to nearly zero, and as shown by the arrow in FIG. 4(b), causes $\varepsilon_2$ to be greater than zero. The ITO of the main body 110 accumulates carriers inside the ITO, which changes the carrier concentration and therefore changes its permittivity. In this special case, elements 110/130/150 are all ENZ materials with certain 'resistance'. But in order to be integrated into the network with topology tunability, we still need the first and third material portions 130, 150 for their tunable functions. Also, the second and fourth material portions 140, 160 are needed to prevent the optical leakage. In one embodiment, only the first material portion 130 is provided, without a third material portion 150.

Thus, the voltage bias applied to the gate 172, 174, 176, changes the material index of the material portions 130, 140, 150, 160, 130a, 130b, 140a, 140b, 102 to change the operation of the opto-electronic device 100, such that the main body 110 simulates and operates as a resistor, capacitor, capacitor with resistor, or inductor with resistor. It is noted that although an ITO is not listed for a capacitor material in Table 1, it is possible to simulate a capacitor (with resistor) or an inductor with resistor by using ITO material. Each material has its own permittivity $\varepsilon = \varepsilon 1 + i*\varepsilon 2$, where $\varepsilon 1$ is the real part of the permittivity and $\varepsilon 2$ is the imaginary part. The first permittivity $\varepsilon 1$ is used to determine whether the main body 110 is 'capacitor-like ($\varepsilon 1 > 0$)', or 'inductor-like ($\varepsilon 1 < 0$)', or 'ENZ ($\varepsilon 1 \approx 0$)', or 'EVL ($\varepsilon 1 >> \varepsilon_0$)'. And the imaginary part $\varepsilon 2$ determines the loss (resistance) of 110.

N×N Array Functions and Calculations

In one example embodiment of the invention, the programmable nanophotonic R/L/C elements 100 can be utilized to achieve transformative performance benefits. One embodiment of the invention can be, for example, to solve Partial Differential Equations (PDE). Consider the following application: a two-dimensional steady-state heat distribution problem (FIG. 5). A conducting sheet is provided with left and right edges maintained at a constant temperature of 323K (50° C.) and 273 K (0° C.) respectively.

We seek to the determine the temperature at any arbitrary point $T_{x,y}$. The temperature distribution (in Kelvin) can be described by the 2D Poisson equation $\nabla^2 T = g$ where g is the internal heat source (in our case it is zero). That is, $$\frac{\partial^2 T}{\partial x^2} + \frac{\partial^2 T}{\partial y^2} = g \quad (1)$$

Consider the first term of the equation $$\frac{\partial^2 T}{\partial x^2}.$$

We can convert this into a difference form in a number of ways. For example, using the central difference formula, a first order derivative at the position x=i can be approximated as follows:

$$\left(\frac{\partial T}{\partial x}\right)_i \approx \frac{T_{i+2/2} - T_{i-1/2}}{\Delta x}$$

Therefore, the second order derivative can be approximated as follows:

$$\left(\frac{\partial^2 T}{\partial x^2}\right)_i = \quad (2)$$

$$\left[\frac{\partial}{\partial x}\left(\frac{\partial T}{\partial x}\right)\right]_i \approx \frac{\left(\frac{\partial T}{\partial x}\right)_{i+\frac{1}{2}} - \left(\frac{\partial T}{\partial x}\right)_{i-\frac{1}{2}}}{\Delta x} \approx \frac{\left(\frac{T_{i+1}-T_i}{\Delta x}\right) - \left(\frac{T_i - T_{i-1}}{\Delta x}\right)}{\Delta x} =$$

$$\frac{T_{i+1} + T_{i-1} - 2T_i}{(\Delta x)^2}$$

Figure 5A:
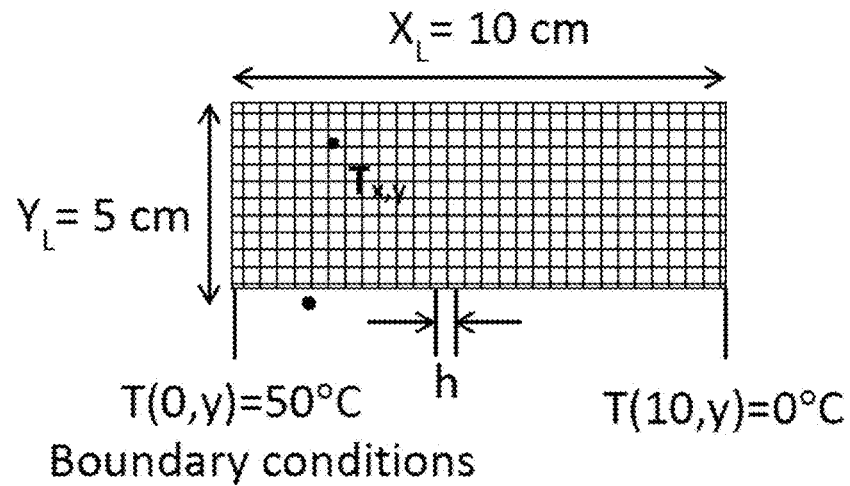
FIG. 5(a) is an example of a 2D heat distribution problem.
Figure 5D:
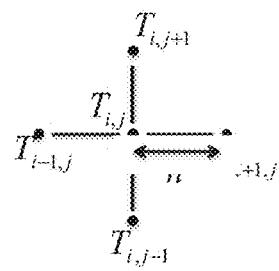
FIG. 5(d) is a large resistor network that can solve the Laplace equation, which can be used, for example, to solve heat distribution calculations (where the Laplace equation is a special case of Poisson equation with g=0 in equation (1) below)
Figure 5D:
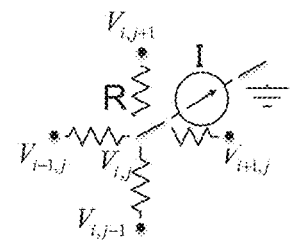
Figure 5D:
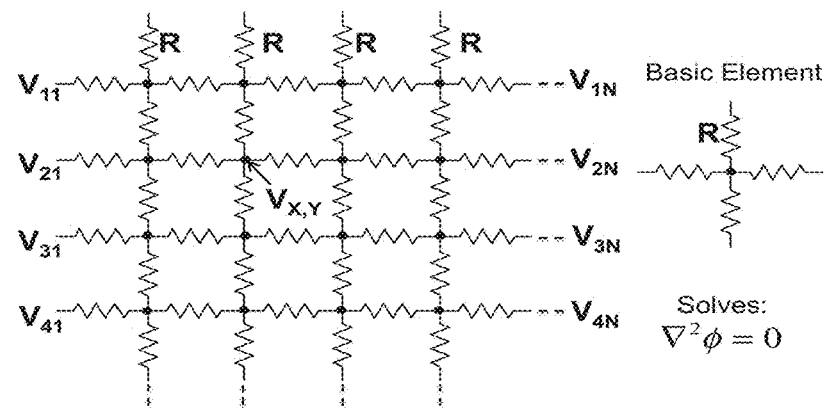

Using (2), we can thus obtain the difference equation for (1) at point (i,j) as the following:

$$\frac{T_{i+1,j} + T_{i-1,j} - 2T_{i,j}}{h^2} + \frac{T_{i,j+1} + T_{i,j-1} - 2T_{i,j}}{h^2} = g$$

for arbitrarily small step size 'h' (which is same as Δx in eq. (1) and (2)). FIG. 5(b) shows this 2D discretization around the point of interest with co-ordinates (i,j).

Rearranging terms reveals that this is equivalent to the relationship obtained from Kirchoff's Current Law (KCL) applied to the center node in the depicted basic electrical network shown in FIG. 5(c):

$$\frac{V_{i+1,j} - V_{i,j}}{R} + \frac{V_{i-1,j} - V_{i,j}}{R} + \frac{V_{i,j+1} - V_{i,j}}{R} + \frac{V_{i,j-1} - V_{i,j}}{R} = I$$

where $R = h^2 R_0$ and $I = g/R_0$ with $R_0$ being chosen suitably so that the resulting values of R and I are supported by the chip (for our example here, g=0 and therefore I=0, which means there is no additional current source at each node of the circuit). The value of h governs the accuracy of the solution, with increasing accuracy for smaller h. Depending on the problem size (the X and Y dimensions), one would need to choose value of 'h' so that the resulting grid size can be contained within the number of circuit elements (resistors) available on the silicon chip. A large resistor network, see FIG. 5(d), can thus solve the original PDE for the heat transfer problem. There is a direct correspondence between the temperature T and voltage V. The boundary conditions on the temperature are established by setting the voltages $V_0, V_1, V_2, \ldots$ on the left edge of the 2D array to a fixed value. The solution to the PDE, or in other words, the temperature $T_{x,y}$ at any arbitrary point (x,y), is obtained by simply reading out the voltage Vx,y after providing a short time for the steady state values to settle. Thus the electrical analog solves the PDE almost instantaneously.

Architecture of the ROC

One illustrative, non-limiting example of the present invention is a Reconfigurable Optical Coprocessor (ROC), which is a new class of accelerators that performs analog computations and works from the first principles to achieve higher speed. It uses nanophotonic elements 100 for speed, low power and small area footprint. The system adopts the use of 3D stacking for higher bandwidth and faster communication times through the Through Silicon Vias (TSVs) or any other 3D integration technology.

Referring to FIGS. 6(b), (c), the network 200 of the present invention can have, for example, three layers (i) an optical co-processing plane 230 that use one or many nanophotonic RLC circuits 100, (ii) a programming plane 210 that holds the digital configuration data for defining the values of the R/L/C elements 100 as well as their connectivity and the values of the laser intensity; the driver circuitry 216 also converts the digital data into analog electrical signals such as the voltage bias 209 needed to tune the photonic R/L/C components 100 and lasers 214, and (iii) a plane 240 for facilitating digital readout of the values from the array 210, and interface to the rest of the system.

Figure 6A:
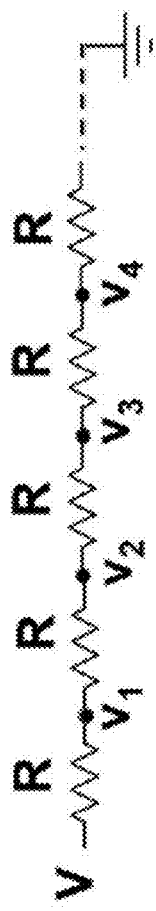
FIG. 6(a) is a desired 1-D resistor electric circuit array for purposes of illustrating the invention (in other examples, the elements can be resistors, inductors or capacitors)
Figure 6B:
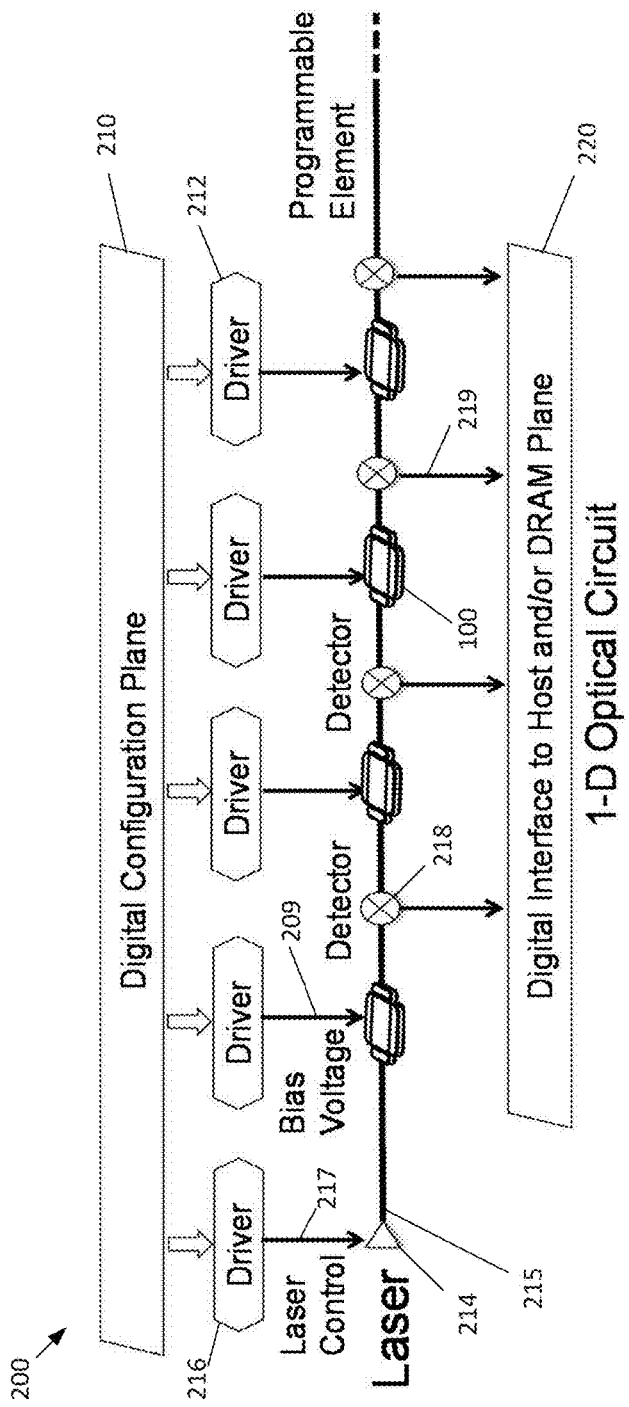
FIG. 6(b) is a 1-D optical circuit in accordance with an example embodiment of the invention to implement the resistor array of FIG. 6(a)
Figure 6C:
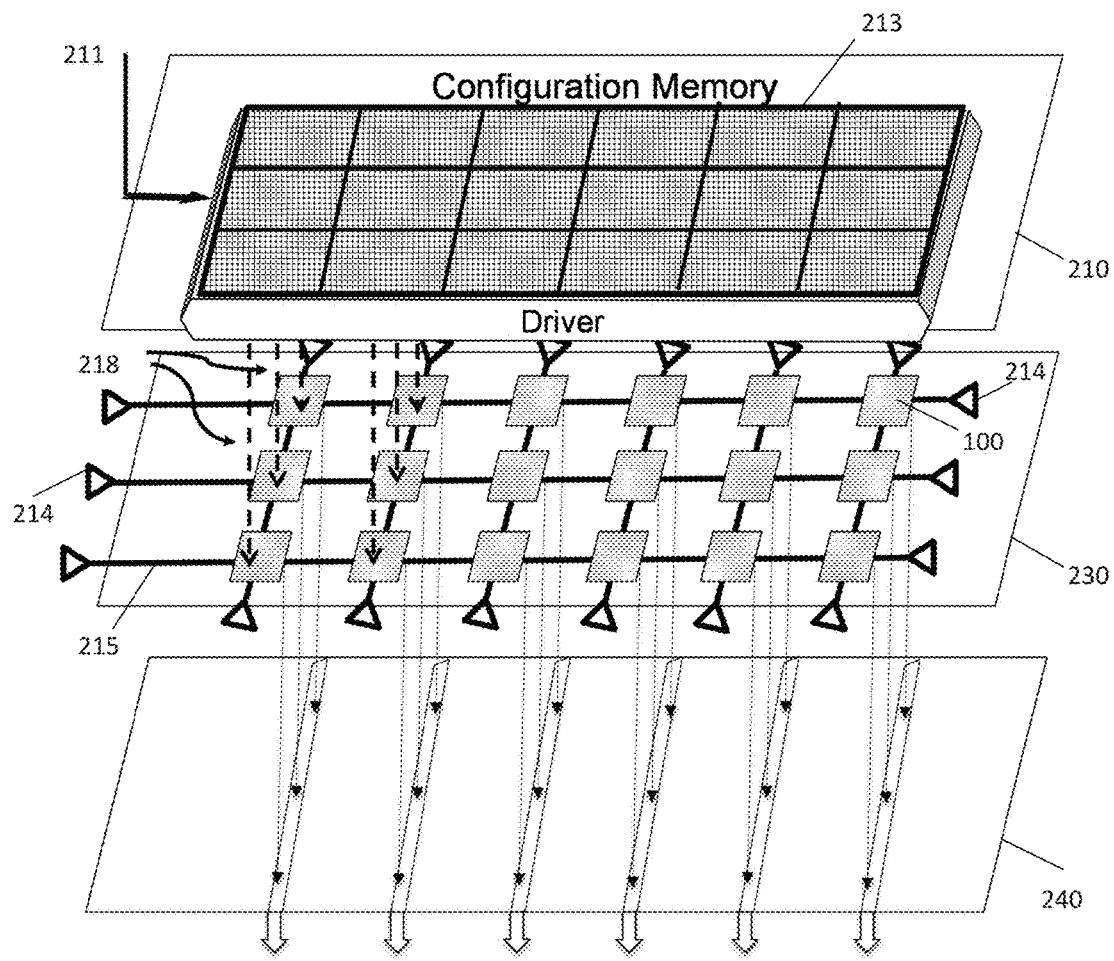
FIG. 6(c) is an overall system architecture diagram.

FIG. 6 shows a one-dimensional simplified example of the system. FIG. 6(a) shows a desired linear resistor array in convention form, and the corresponding manifestation in the ROC of the present invention is shown in FIGS. 6(b), (c). Boundary conditions are established through the laser intensity on the left and right side of the 2D array in FIG. 6(c) (to solve the Laplace equation, only the lasers on the left and right edge of the chip need to be turned on; although not shown in this figure, the configuration plane also controls the drive current of the lasers). If a pure optical resistor array (solving $\nabla^2 = 0$ as described before) is used, the equivalent voltages are obtained by reading out the light intensity at the required point in the array (to obtain $T_{x,y}$ as described earlier). Note that this is achieved by using photodetectors 218, in FIG. 6(b), at the ports of each of the programmable optical elements 100. The output of the photodetector is suitably scaled to match the voltage values in the analog formulation of the PDE. The output then goes through analog to digital (A/D) converters and on the output readout plane, and is then available for read-out by the host processor. The A/D converters are part of the output plane 220 in FIG. 6(b), and the D/A converters are part of the driver 216 in FIG. 6(b). In one embodiment where all the optical element values are the same (such as a resistor network with identical resistances), it is possible to provide a programmable option wherein only one data word is sent to the ROC, which then internally replicates the data word to program all the optical elements.

In FIG. 6(b), the network 200 has a digital configuration plane 210, drivers 216, light source 214, and digital interface to host and/or DRAM plane 220. The digital configuration plane 210 controls the laser driver 216 to apply a control signal 217 over a line or wire to the light source 214, here a laser. The laser 214 generates a light signal 215 that is transmitted into the opto-electronic device 100, such as discussed above and shown in FIGS. 1-3. The digital configuration plane 210 also controls the opto-electronic device drivers 212 to apply a control signal, here bias voltage 209, over a line or wire to the gates on the opto-electronic device 100. The voltage control signal 209 controls the gates to operate the opto-electronic device 100 to control the light as it passes through the device 100. The voltage control signal 209 is the control voltage that controls the material portions 130-160.

In this 1D optical circuit case, the voltage control signal 209 should tune all the horizontal material portions through the light propagation direction to EVL and other material portions to their ENZ state to prevent any leakage and crosstalk. A detector 218 is provided at the output of each opto-electronic device 100 to detect the light, and outputs a detected signal 219 to the DRAM plane 220. The detector 218 can be coupled to or integrally formed with the opto-electronic device 100, such as shown and described with respect to the detector 180 of FIG. 2. The detector 218 measures the amplitude of the light signal, which is converted to an analog voltage within the detector. This analog voltage is then passed on to the digital readout plane 220, wherein an A/D converter transforms it into a digital value that can be then transferred back to the host processor.

As discussed above with respect to FIG. 4 and Table 1, the operation of the opto-electronic device 100 can be reconfigured to change on demand by varying the voltage bias 209 that is applied to the gates of the material portions. The voltage bias 209 changes the material index of the material portions to change the operation of the opto-electronic device 100. Accordingly, the configuration plane 210 can control the drivers 216, 217 to reconfigure the operation of each opto-electronic device 100 to operate in a desired manner, such as a capacitor, capacitor with resistor, resistor, or inductor with resistor (Table 1). And by changing the operation of the opto-electronic devices 100, different equations can be solved by measuring the detected output at the detectors 218. For instance, if the equivalent basic building block electrical network in FIG. 5(c) uses inductors instead of the resistors, and connects a capacitor between the center node and ground, the overall network will solve a wave equation PDE.

Referring to FIG. 6(c), the host processor transfers the necessary data to program the ROC onto the configuration memory 213, through the host interface 211. The configuration data is used for setting the values of the optical elements 100, which are programmed as a resistor for solving the Laplace equation (2D heat distribution problem) example considered. Along with the configuration data, the host interface 211 also carries address information from the host processor, which indicates the location in the memory 213 where the data needs to be stored. The plane 210 thus houses the configuration memory 213, the host interface 211, as well as D/A converters that transform the stored binary data into voltage values. The driver 212, 216, shown in the plane 210, includes the D/A converters.

A set of bits in the memory 213, shown by one of the boxes in the 3×6 array in FIG. 6(c), represents one data item that is converted into an analog voltage value to control the corresponding optical element in plane 230. The digital value of each data item will range from 0 to the maximum representable value, depending on the number of bits user per data item. The digital to analog converter then maps this binary data into a corresponding voltage value within the range 0 to Vmax, where Vmax is the maximum bias voltage that can drive the optical element 100. The analog voltage value determines the functionality of the optical resistor (or inductor, or capacitor) as well as the magnitude of the optical resistor in ohms (or henry, or farads, respectively). Depending on the PDE to be solved, the magnitude of each the optical element will need to be changed accordingly. In the simple example considered (array of resistors for a 2D heat problem without heat generation), all of the resistor values are equal. It is conceivable to have more complex scenarios wherein heat is absorbed across a region of the 2D surface. In this case, the value of each resistor will be different.

As light spreads across the chip, it is changed (in our simple example, attenuated) and the optical elements 100 in the chip thus emulate passive electrical elements (in our example, resistors). The photodetector at the port of each optical element 100 converts the light amplitude into a voltage value, carrying out an optical to electrical conversion. For the heat distribution problem, this voltage is equivalent to the temperature value at that location in the original 2D problem. Note that the dimensions of the ROC chip will be most likely much smaller than the 2D problem considered; the co-ordinates on the chip thus are direct linear projections of the 2D problem surface onto the chip area. The temperature at a given location (i.e., at any arbitrary point (x, y)) is the PDE solution that is desired. The equivalence between the photodetector output voltage and the temperature at a given location is a fixed scaling factor, and this factor depends on the specific PDE being solved. The plane 240 converts the voltage into a digital value using an analog to digital converter, since the data finally sent back to the host processor needs to be digital (since modern CPUs are digital). The plane 240 also contains the host interface to allow readout of the output data. It is also possible to include a memory array, similar to 210, in the plane 214, to hold the output data for readout by the host CPU.

Metrics and Improvements

Figure 7:
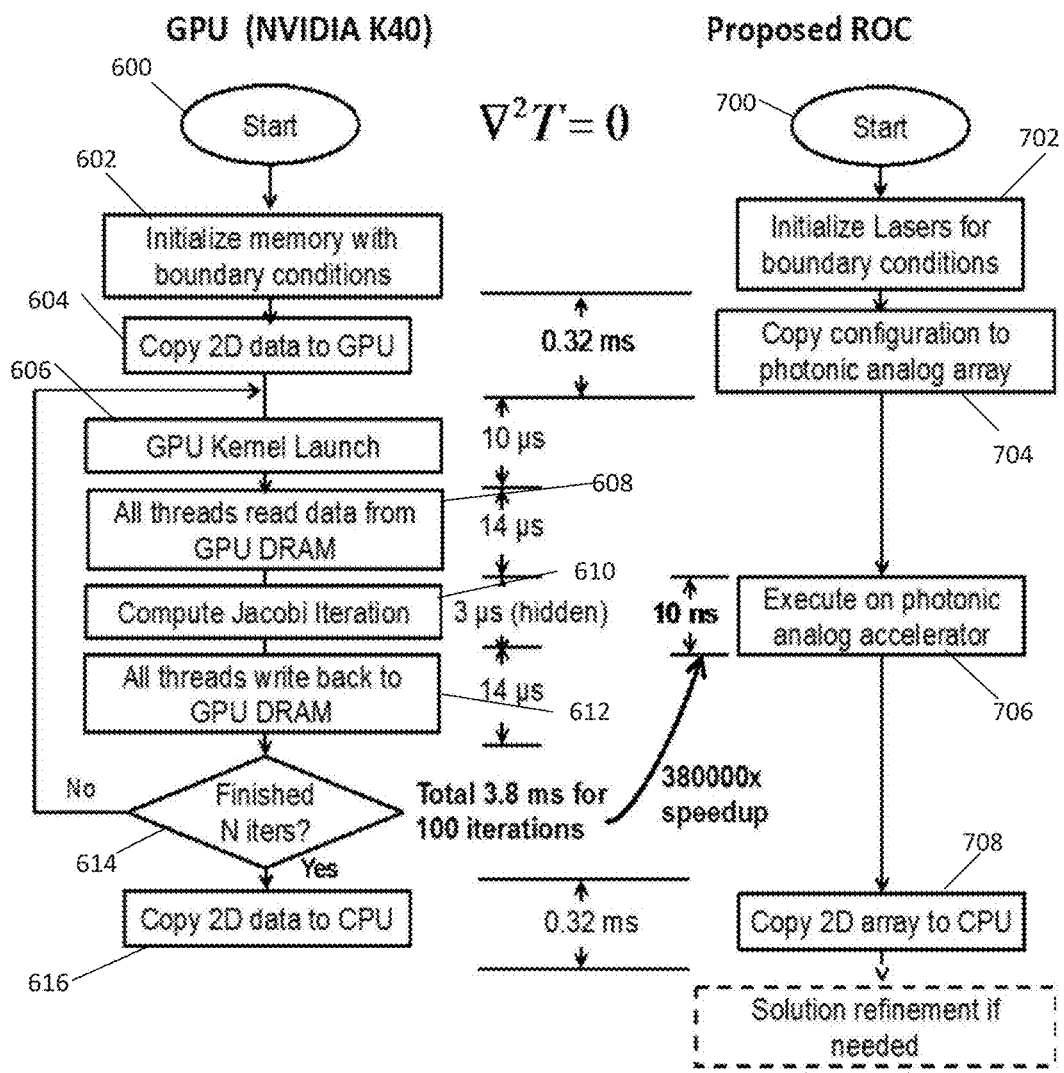
FIG. 7 is a computation of 2D Laplace equation using an NVIDIA K40 GPU compared to the present invention ROC, where the problem size is 1000×1000 and the estimates are for single precision floating point for the GPU.

The primary metrics for evaluating the ROC of the present invention are speedup, and power consumption, and the notion of parallelism from both optics and analog computing. FIG. 7 shows initial estimates for a 2D Laplace equation $\nabla^2 T=0$ compared with a GPU, for a problem size of 1000×1000. FIG. 7 is a comparison of the different steps in using the ROC of the present invention, step 700, as against conventional technology represented by a GPU, step 600. A GPU is a computation accelerator that helps the main program running on the CPU. The steps involved for a GPU-based computation are as follows. Data for the boundary conditions is initialized in the CPU memory, step 602. Subsequently, this data is copied over to the GPU, step 604. Data transfer and memory access costs for GPU, both steps 604 and 616, are optimistically computed as data size divided by the bandwidth (PCIe 3.0~12 GB/s, GPU memory bandwidth=288 GB/s, data size is 64 MB for single precision, data transfer time=data size/bandwidth). Subsequently, several Jacobi iterations of the 2D heat distribution are computed, which involves GPU kernel launch, step 606; all GPU threads reading the data of the current iteration, step 608; current iteration data is the temperature values of each point in the 2D sheet considered; this is followed by the computation using the threads, step 610, and the write back of computed iteration output, step 612. The computation time 610 is hidden as it overlaps with the data accesses steps 608 and 612. After N iterations (we took N=100 for this example), step 614, the process completes and the data is copied back to the CPU, step 616.

On the other hand, the steps for analog computing using the ROC, step 700, are significantly less. After copying the configuration data to setup the resistor values, step 704, the ROC finishes computation in just 10 ns, step 706, as there are no iterations needed in the analog domain. Output data is then copied back to the CPU, step 708. Estimated speedup for the computation is five orders magnitude (see Table 2 summary). The GPU is rated at 235 W, out of which we assume one third, ~78 W, is used by the computational elements alone. Thus for the compute portion, an execution time of 3.8 ms results in computational energy of 298 mJ.

On the other hand, a 1000×1000 array of ROCs will consume 250 W (including laser power) while the time taken for one computation is only 10 ns, which includes both the time to reconfigure each Reconfigurable Optical Element and the optical time-of-flight for the signal propagating inside the waveguide. Accordingly, the energy estimate is 250 W×10 ns=2.5 µJ. While the configuration circuitry will also consume power, the configuration power should be less than 10 W, looking at Xilinx Spartan FPGAs (Field Programmable Gate Arrays). Assuming 50% of peak capability is achieved on the GPUs (rated at 2 TFLOP/s single precision), the estimated speedup indicates that the array of the present invention can achieve 760 PetaFLOP/s in desktop form factor, though overheads and software refinement could bring this speedup down. Note that we use the same problem size to compare the GPU and the ROC.

TABLE 2

Performance Improvements of ROC over GPU (state of the art) and Memristors

|  | GPU (NVIDIA K40) | Electronic Memristor | ROC (Resistors only) |
|---|---|---|---|
| Area (system) | 551 mm$^2$ | 7000 µm$^2$ | 4 mm$^2$ |
| Area (single element) | N/A | 0.07 µm$^2$ | 4 µm$^2$ |

TABLE 2-continued

Performance Improvements of ROC over GPU (state of the art) and Memristers

|  | GPU (NVIDIA K40) | Electronic Memristor | ROC (Resistors only) |
|---|---|---|---|
| #Elements |  | 1,000,000 |  |
| Energy | 298 mJ | 73 mJ | 2.5 µJ |
| Speed (system iteration) | 3.8 ms | 6 µs | 10 ns = 0.01 µs |
| ROC's Improvement Factor (Speed/(Power·Area)) | ~138 × 119200 × 380000 = 6.2 × 10$^{12}$ | ~0.02 × 29000 × 600 = 3.1 × 10$^5$ | — |

Next we present a comparison against competing electronic technologies, that GPU and memristors, as given by Improvement Factors (Table 2). We compare memristors and nanophotonics given a number of elements (1000×1000) and assuming a resistance value of 500 ohms. For the GPU, we adopt the same problem size (1000×1000) on the NVIDIA K40. Using memristor values reported in [RICH15] our nanophotonics reconfigurable optical coprocessor solution shows a degradation in the area, which we anticipate has minimal impact as the chip size is only 2 mm×2 mm. Nevertheless, we predict a highly energy efficient design with 29000 less energy consumed for the entire computation compared with memristors. Compared with GPU, the ROC is energy efficient by five orders magnitude. The Speed comparison shows that our ROC can be very fast compared to a GPU (FIG. 7), and even outperforms a memristors-based chip by about 600×. One reason behind that is the short time to reconfigure the Reconfigurable Optical Element is based on MOS capacitors similar to MOSFETs, which have shown to switch individually beyond 100 GHz. Here the time taken for computation is expected to be dominated by a) the time for programming the reconfigurable elements, and b) the optical propagation delay between neighboring Reconfigurable Optical Elements. Note however, the time required to program the array by writing to configuration memory is not listed in Table 2. Note, time for configuration is actually shown in FIG. 7 in our comparison with GPU. Overall, compared to memristors, the combined Improvement Factor from multiplying all the individual improvement factors above is around 306, 600. This is quite a significant value, and can be treated as a step n upper bound for the expected gains.

It is further noted that in the embodiment of FIGS. 6(b), 6(c), the digital configuration plane 210, drivers 216, and DRAM plan 220 can include a processing device to perform various functions and operations in accordance with the invention. The processing device can be, for instance, a computer, personal computer (PC), server or mainframe computer, or more generally a computing device, processor, application specific integrated circuits (ASIC), or controller. The processing device can be provided with one or more of a wide variety of components or subsystems including, for example, a co-processor, register, data processing devices and subsystems, wired or wireless communication links, input devices (such as touch screen, keyboard, mouse) for user control or input, monitors for displaying information to the user, and/or storage device(s) such as memory, RAM, ROM, DVD, CD-ROM, analog or digital memory, flash drive, database, computer-readable media, floppy drives/disks, and/or hard drive/disks. All or parts of the system, processes, and/or data utilized in the invention can be stored on or read from the storage device(s). The storage device(s) can have stored thereon machine executable instructions for performing the processes of the invention. Note that the execution process of the core computation itself doesn't require instructions as it is an analog computing engine; nevertheless, setting up the device functionality, inputs, as well as output readout can be aided through an instruction-based CPU. Unless indicated otherwise, the process is preferably implemented in automatically by the processor substantially in real time without delay. In addition, the network 101 of devices 100 can be a processing device, such as a processor, controller, computer or the like.

It should further be noted that the description uses several geometric or relational terms, such as square, rectangular, elongated, parallel, perpendicular, and flat. In addition, the description uses several directional or positioning terms and the like, such as top, bottom, front, rear, left, right, up, down, and center. Those terms are merely for convenience to facilitate the description based on the embodiments shown in the figures. Those terms are not intended to limit the invention. Thus, it should be recognized that the invention can be described in other ways without those geometric, relational, directional or positioning terms. In addition, the geometric or relational terms may not be exact. For instance, walls may not be exactly perpendicular or parallel to one another but still be considered to be substantially perpendicular or parallel because of, for example, roughness of surfaces, tolerances allowed in manufacturing, etc. And, other suitable geometries and relationships can be provided without departing from the spirit and scope of the invention.

The references noted above and the following documents are herein incorporated by reference:

[ALU07] Alù A, Silveirinha M G, Salandrino A, et al. Epsilon-near-zero metamaterials and electromagnetic sources: Tailoring the radiation phase pattern [J]. Physical Review B, 2007, 75(15): 155410.

[ENGH07] Engheta, N. (2007). Circuits with light at nanoscales: optical nanocircuits inspired by metamaterials. Science, 317(5845), 1698-1702.

[LEIB50] G. Liebmann, "Solution of partial differential equations with a resistance network analogue." British Journal of Applied Physics 1, no. 4, 1950, pp. 92-103.

[LLOY00] Lloyd, S., Ultimate physical limits to computation. Nature, 406(6799), 1047-1054.

[MA15] Ma Z, Li Z, Liu K, et al. Indium-Tin-Oxide for High-performance Electro-optic Modulation [J]. Nanophotonics, 2015, 4(1).

[NARA14] Vikram K Narayana, Olivier Serres, Jason Lau, Stuart Licht, and Tarek El-Ghazawi, "Towards a Computational Model for Heat Transfer in Electrolytic Cells," In Proc. 5th International Conference on Computer Modeling and Simulation (ICCMS 2014), 20-21 Feb. 2014, Barcelona, Spain.

[RICH15] I. Richter, K. Pas, X. Guo, R. Patel, J. Liu, E. Ipek, and E. G. Friedman, "Memristive Accelerator for Extreme Scale Linear Solvers," Proceedings of the Government Microcircuit Applications & Critical Technology Conference (GOMACTech), March 2015.

[SETH12] Sethumadhavan, Simha, Ryan Roberts, and Yannis Tsividis. "A case for hybrid discrete-continuous architectures." Computer Architecture Letters 11, no. 1 (2012): 1-4.

[SILV14] Silva A, Monticone F, Castaldi G, et al. Performing mathematical operations with metamaterials [J]. Science, 2014, 343(6167): 160-163.

[SORG09] V. J. Sorger, R. F. Oulton, J. Yao, G. Bartal and X. Zhang "Fabry-Perot Plasmonic Nanocavity" Nano Letters 9, 3489-3493 (2009).

[SORG12] Sorger V J, Lanzillotti-Kimura N D, Ma R M, et al. Ultra-compact silicon nanophotonic modulator with broadband response[J]. Nanophotonics, 2012, 1(1): 17-22.

[THRU15] http://www.thruchip.com/applications.htm

[YIN11] Yin, Hezhu. Application of Resistivity-Tool-Response Modeling For Formation Evaluation: AAPG Archie Series, No. 2. Vol. 2. AAPG, 2011.

The foregoing description and drawings should be considered as illustrative only of the principles of the invention. The invention may be configured in a variety of shapes and sizes and is not intended to be limited by the preferred embodiment. Numerous applications of the invention will readily occur to those skilled in the art. Therefore, it is not desired to limit the invention to the specific examples disclosed or the exact construction and operation shown and described. Rather, all suitable modifications and equivalents may be resorted to, falling within the scope of the invention.

The invention claimed is:

1. A reconfigurable optical-electronic device comprising:
a main body for propagating light, said main body having a first side, a second side opposite the first side, a third side and a fourth side opposite the third side;
a first material portion having a first side and a second side opposite the first side, the first side of said first material portion coupled with the first side of said main body to pass light between said main body and said first material portion;
a second material portion having a first side and a second side opposite the first side, the first side of said second material portion coupled with the second side of said main body to pass light between said main body and said second material portion;
a third material portion having a first side and a second side opposite the first side, the first side of said third material portion coupled with the third side of said main body to pass light between said main body and third material portion;
a fourth material portion having a first side and a second side opposite the first side, the first side of said fourth material portion coupled with the fourth side of said main body to pass light between said main body and said fourth material portion;
a first conductive plate coupled to the first material portion and a second conductive plate coupled to the second material portion, said first and second conductive plates receiving a first control signal and applying said first control signal to said first and second material portions respectively to control said main body to simulate a circuit element; and
a third conductive plate coupled to the third material portion and a fourth conductive plate coupled to the fourth material portion, said second and third conductive plates receiving a second control signal and applying said second control signal to said third and fourth material portions respectively to control said main body to simulate the circuit element.

2. The optical-electronic device of claim 1, wherein said circuit element is a capacitor, resistor, capacitor with resistor, or inductor with resistor.

3. The optical-electronic device of claim 1, wherein the control signal is a voltage bias.

4. The optical-electronic device of claim 1, wherein said main body is made of indium tin oxide, silicon dioxide, silicon nitride, doped silicon, gold, silver, or aluminum.

5. The optical-electronic device of claim 1, wherein the control signal controls said first, second, third and fourth material portions to comprise an epsilon very large or epsilon near zero material.

6. The optical-electronic device of claim 1, further comprising a light source generating a light signal, wherein:
the first material portion receives the light signal at the second side and passes the light signal out the first side;
the main body receives the light signal from the first side of the first material portion and passes the light signal out of the second side; and
the second material portion receives the light signal from the second side of the main body and passes the light signal out of the second side of the second material portion.

7. The optical-electronic device of claim 6, further comprising a light detector receiving the light signal from the second side of the second material portion.

8. The optical-electronic device of claim 6, further comprising a controller generating a light source control signal to control the light source.

9. The optical-electronic device of claim 1, further comprising a controller generating the control signal.

10. The optical-electronic device of claim 1, further comprising a network having an array of optical-electronic devices, each optical-electronic device simulating a circuit element.

11. The optical-electronic device of claim 10, wherein said network represents a Partial Differential Equation (PDE) and solves the PDE.

12. The optical-electronic device of claim 1, wherein each of the material portions is made of indium tin oxide.

13. The optical-electronic device of claim 1, wherein said main body is a square.

14. The optical-electronic device of claim 1, wherein each of said material portions are a rectangular prism.

15. A reconfigurable optical-electronic device comprising:
a main body for propagating light, said main body having a first side surface, a second side surface opposite the first side surface a third side surface and a fourth side surface opposite the third side surface;
a first material portion having a first side surface and a second side surface opposite the first side surface, the first side surface of said first material portion coupled with the first side surface of said main body;
a second material portion having a first side surface and a second side surface opposite the first side surface, the first side surface of said second material portion coupled with the second side surface of said main body;
a third material portion having a first side surface and a second side surface opposite the first side surface, the first side surface of said third material portion coupled with the third side surface of said main body;
a fourth material portion having a first side surface and a second side surface opposite the first side surface, the first side surface of said fourth material portion coupled with the fourth side surface of said main body; and
a first conductive plate coupled to the first material portion, a second conductive plate coupled to the second material portion, a third conductive plate coupled to the third material portion, and a fourth conductive plate coupled to the fourth material portion, said first, second, third and fourth conductive plates receiving a control signal and applying said control signal to said first, second, third and fourth material portions respectively to control said main body to simulate a circuit element.

16. The optical-electronic device of claim 15, further comprising a light source generating a light signal passing through said first material portion, said main body, and said second material portion.

17. A reconfigurable opto-electronic computing (ROC) system comprising:
a network of optical nodes, each of said optical nodes having at least one reconfigurable optical element (ROE) that receives and modifies an optical signal;
wherein said ROEs change optical properties in response to an outside stimulus to emulate one or more electric circuit components;
wherein said ROEs of said network of optical nodes are interconnected with each other such that photons propagate from one ROE to another;
wherein said ROC emulates and analyzes an electric circuit in an optical domain to we performance of the system based on the ROE; and
wherein each node electrically, thermally, or optically represents a problem of a Partial Differential Equation (PDE).

18. The system of claim 17, wherein the optical properties include optical index.

19. The system of claim 17, wherein the outside stimulus can be electro-optical, electrical, all-optical, and/or thermal.

20. The system of claim 17, wherein the conditions are energy consumption and/or speed of computing.

21. The system of claim 17, wherein a light source can be on or off-chip and be coherent or incoherent.

22. The system of claim 21, wherein the coherent light source is a laser and the incoherent light source is an LED.

23. The system of claim 17, further comprising a programmable memory that holds voltage biases for programming the network of ROEs.

24. The system of claim 17, further comprising a set of analog-to-digital and digital-to-analog converters for interfacing.

25. The system of claim 17, wherein the electric circuit component can be implemented in either optical or photonic scheme using i) integrated photonics, ii) fiber optics, iii) free-space interconnected ROEs, iv) nanophotonics, or v) metatronic lumped-elements.

26. The system of claim 17, the ROE further comprising a main body made of Silicon, Silicon nitride, III-V, InP, or GaAs.

27. The system of claim 17, the ROE further comprising a main body made of SiO2 or other fiber-based systems.

28. The system of claim 27, wherein said ROE further comprises:
a main body that propagates light and has a first side and a second side opposite the first side, and further comprising:
a first material portion having a first side and a second side opposite the first side, the first side of said first material portion coupled with the first side of said main body to pass light between said main body and said first material portion;
a second material portion having a first side and a second side opposite the first side, the first side of said second material portion coupled with the second side of said main body to pass light between said main body and said second material portion; and
a first conductive plate coupled to the first material portion and a second conductive plate coupled to the second material portion, said first and second conductive plates receiving a first control signal and applying said first control signal to said first and second material portions respectively to control said main body to simulate a circuit element.

29. The system of claim 28, further comprising:
the main body having a third side and a fourth side opposite the third side;
a third material portion having a first side and a second side opposite the first side, the first side of said third material portion coupled with the third side of said main body to pass light between said main body and said third material portion;
a fourth material portion having a first side and a second side opposite the first side, the first side of said fourth material portion coupled with the fourth side of said main body to pass light between said main body and said fourth material portion;
a third conductive plate coupled to the third material portion and a fourth conductive plate coupled to the fourth material portion, said second and third conductive plates receiving a second control signal and applying said second control signal to said third and fourth material portions respectively to control said main body to simulate a circuit element.

* * * * *